(12) United States Patent
Hong

(10) Patent No.: US 7,642,186 B2
(45) Date of Patent: Jan. 5, 2010

(54) METAL LINE OF SEMICONDUCTOR DEVICE AND METHOD OF FORMING THE SAME

(75) Inventor: Ji Ho Hong, Hwaseong-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 209 days.

(21) Appl. No.: 11/863,481

(22) Filed: Sep. 28, 2007

(65) Prior Publication Data

US 2008/0157373 A1   Jul. 3, 2008

(51) Int. Cl.
*H01L 21/4763* (2006.01)
(52) U.S. Cl. ............... 438/637; 438/687; 257/E21.577
(58) Field of Classification Search ................. 438/637, 438/643, 675, 678, 687; 257/E21.577, E21.578
See application file for complete search history.

(56) References Cited

U.S. PATENT DOCUMENTS 7,238,617 B2 *   7/2007   Hong ......................... 438/687

* cited by examiner

*Primary Examiner*—Hoai V Pham
(74) *Attorney, Agent, or Firm*—Saliwanchik, Lloyd & Saliwanchik

(57) ABSTRACT

A metal line of semiconductor device and a method of forming the same are provided. An interlayer dielectric (ILD) layer is formed on a semiconductor substrate including a lower line. A via hole is formed in the ILD layer, and a diffusion barrier layer is formed on the ILD layer where the via hole is formed. A copper seed layer and a copper plating layer are repeatedly formed and etched until the hole is completely filled.

13 Claims, 5 Drawing Sheets

METAL LINE OF SEMICONDUCTOR DEVICE AND METHOD OF FORMING THE SAME

CROSS-REFERENCE TO RELATED APPLICATION

The present application claims the benefit under 35 U.S.C. §119 of Korean Patent Application No. 10-2006-0135569, filed Dec. 27, 2006, which is hereby incorporated by reference in its entirety.

BACKGROUND

As high-speed performance and high integration of semiconductor devices becomes more important, research regarding the use of copper metal lines is becoming more common. Copper has higher electromigration resistance and lower bulk resistivity than the aluminum or aluminum alloy that is often used as a material for metallization in a related art semiconductor device.

When used in a semiconductor device, copper lines are typically formed using a damascene process.

The damascene process generally includes forming a trench, filling copper into the trench by electrochemical plating (ECP), and removing overfilled copper by chemical mechanical polishing (CMP).

Since ECP typically provides better bottom-up gapfill capability than a physical vapor deposition (PVD) or a chemical vapor deposition (CVD), ECP is often used to form copper lines.

As the technology of semiconductor devices continues to advance, the desired width of gates becomes smaller and finer patterns are required.

Accordingly, copper lines in semiconductor devices are also becoming smaller, leading to voids or seams in via holes and trenches for small-sized copper lines. Thus, a need exists in the art for a metal line of a semiconductor device and fabricating method thereof which includes copper lines formed without voids or seams.

BRIEF SUMMARY

Embodiments of the present invention provide a metal line of a semiconductor device and fabricating method thereof which inhibits voids and seams from being formed inside copper metal lines. According to embodiments, a multi copper wet etch (MCWE) process is used, in which a process of forming a copper seed layer, a process of plating copper, and an etching process are repetitively performed to achieve bottom-up gapfilling for a damascene pattern.

A method of forming a metal line of a semiconductor device, according to an embodiment of the present invention, includes: forming an interlayer dielectric layer on a semiconductor substrate having a lower line; forming a via hole in the interlayer dielectric layer; forming a diffusion barrier layer on the interlayer dielectric layer where the via hole is formed; forming a copper seed layer and a copper plating layer on the diffusion barrier layer; etching the copper seed layer and the copper plating layer to a level of the copper plating layer that completely fills the via hole horizontally to thereby form a copper plating structure; repeating the forming and the etching of the copper seed layer and the copper plating layer until the via hole with the copper plating structure formed is filled with the copper plating layer; and planarizing the copper plating structure to form a copper metal line in the via hole.

A metal line of a semiconductor device, according to an embodiment of the present invention, includes: an interlayer dielectric layer disposed on a semiconductor substrate having a lower line; a via hole provided in the interlayer dielectric layer; a diffusion barrier layer provided in the via hole; a first copper plating structure disposed on the diffusion barrier layer at a lower portion of the via hole; and a second copper structure disposed on the first copper plating structure at an upper portion of the via hole.

The details of one or more embodiments are set forth in the accompanying drawings and the detailed description. Other features will be apparent to those skilled in the art from the detailed description, the drawings, and the appended claims.

DETAILED DESCRIPTION OF THE EMBODIMENTS

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 9:
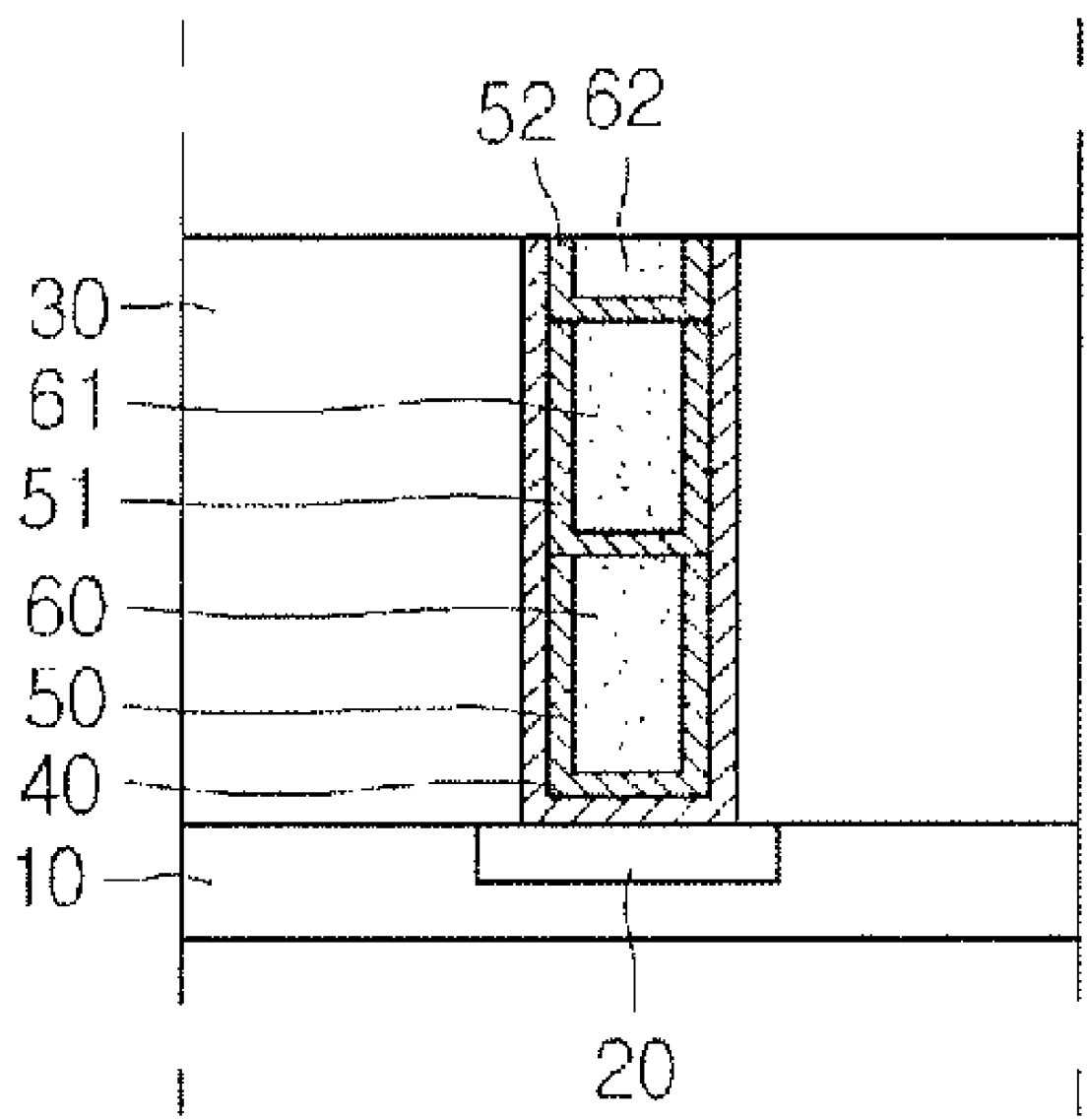

FIG. 9 is a sectional view showing a metal line of a semiconductor device according to an embodiment of the present invention.

A metal line of a semiconductor device according to an embodiment of the present invention includes an interlayer dielectric (ILD) layer 30 disposed on a semiconductor substrate 10 having a lower line 20. A via hole (see 100 of FIGS. 1 to 7) is provided in the ILD layer 30, and a diffusion barrier layer 40 can be disposed inside the via hole 100. A first copper plating structure can be disposed on the diffusion barrier layer 40 in a lower portion of the via hole 100, a second copper plating structure can be disposed on the first copper plating structure in a middle portion of the via hole 100, and a third copper plating structure can be disposed on the second copper plating structure in an upper portion of the via hole 100.

In an embodiment, the first copper plating structure can include a first copper seed layer 50 and a first copper plating layer 60.

The second copper plating structure can include a second copper seed layer 51 and a second copper plating layer 61.

The third copper plating structure can include a third copper seed layer 52 and a third copper plating layer 62.

FIGS. 1 to 9 are cross-sectional views illustrating a method of forming a metal line of a semiconductor device according to an embodiment.

Figure 1:
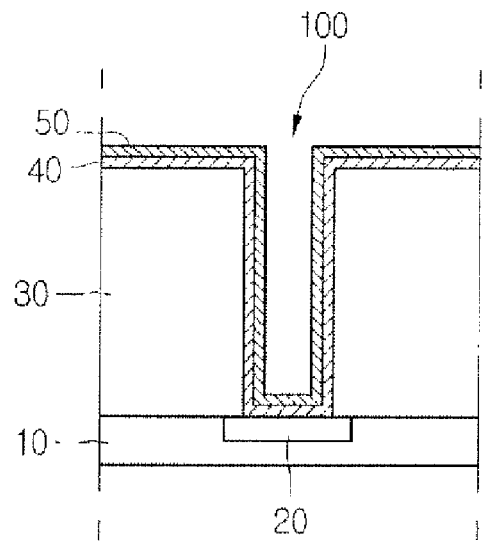
FIGS. 1 to 9 are cross-sectional views showing a method of forming a metal line of a semiconductor device according to an embodiment of the present invention.

Referring to FIG. 1, in many embodiments an ILD layer 30 can be formed on a semiconductor substrate 10 having a lower line 20. In an embodiment, the ILD layer is an oxide layer. The ILD layer 30 can be etched to form a via hole 100 exposing the lower line 20.

Although not shown, in an embodiment, a field oxide layer may be formed in a field region of the semiconductor substrate 10 to define an active region of the semiconductor substrate 10. A transistor configured with a source, a drain, and a gate electrode may also be formed in the active region.

A predetermined pattern can be formed using a damascene process to form the via hole 100 exposing the lower line 20.

A diffusion barrier layer 40 can be formed on the ILD layer 30. The diffusion barrier layer 40 can prevent or inhibit diffusion of copper into the ILD layer 30.

A copper seed layer 50 can be formed on the diffusion barrier layer 40.

Figure 2:
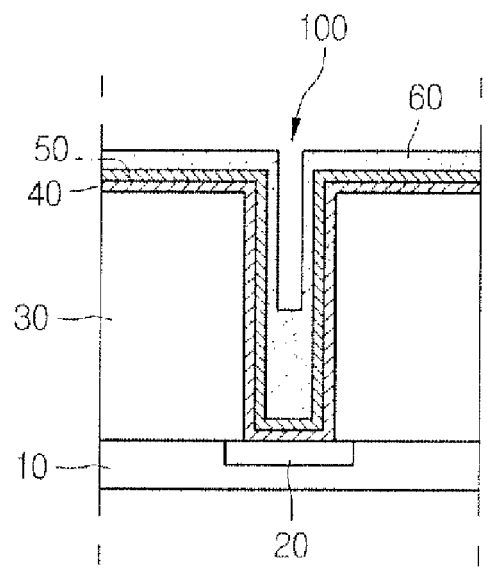

Referring to FIG. 2, copper can be filled into the via hole 100. For example, the filling of the copper can be performed using an electrochemical plating (ECP) process.

In embodiments in which the via hole 100 has a high aspect ratio, a copper plating layer 60 is deposited on the copper seed layer 50 to fill the via hole 100. Copper is typically deposited faster at an inlet portion of the via hole 100 than the inside of the via hole 100, which could cause a void or seam to be created inside the copper plating layer 60 formed in the via hole 100.

To inhibit the creation of a void, the copper plating layer 60 can be formed on the copper seed layer 50 such that it completely fills a lower portion of the via hole 100 horizontally but does not completely fill an upper portion of the via hole 100. The copper seed layer 50 and the copper plating layer 60 can be etched to a level of the copper plating layer 60 that completely fills a lower portion of the via hole horizontally to thereby form a copper plating structure. Accordingly, a copper plating structure including the copper seed layer 50 and the copper plating layer 60 can be formed in the lower portion of the via hole 100.

In an embodiment, after a first copper seed layer 50 is formed along the diffusion barrier layer 40 formed in the via hole 100, a first copper plating layer 60 can be formed by an ECP process. The lower region of the via hole 100 is completely filled with copper but an upper region of the via hole 100 is not completely filled with copper.

Figure 3:
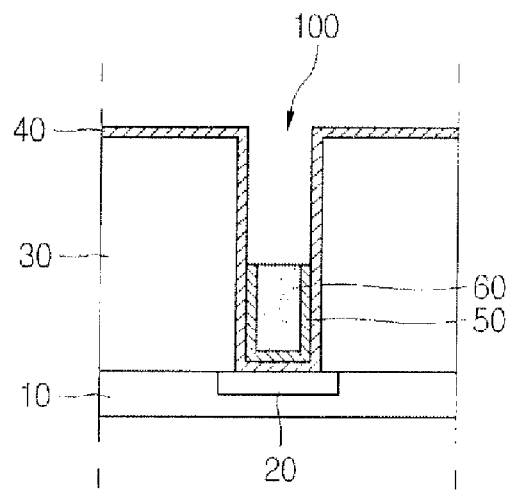

Referring to FIG. 3, the first copper seed layer 50 and the first copper plating layer 60 can be wet-etched to a level that completely fills a lower portion of the via hole 100 horizontally, thereby forming a copper plating structure including the first copper seed layer 50 and the first copper plating layer 60 in the via hole 100. In an embodiment, the height of the first copper seed layer 50 is approximately the same as that of the first copper plating layer 60 after the wet-etching process.

Figure 4:
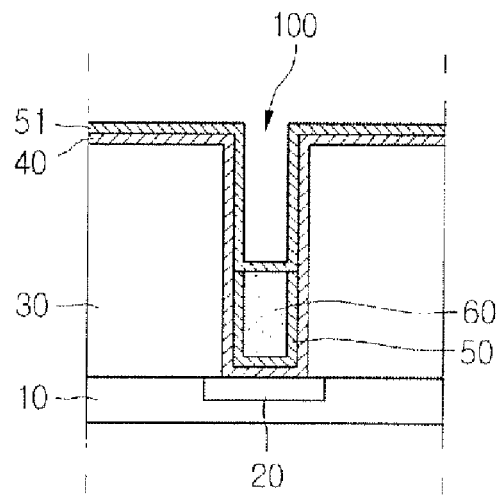

Referring to FIG. 4, after forming the first copper structure in the via hole 100, a second copper seed layer 51 can be formed on the first copper structure.

Figure 5:
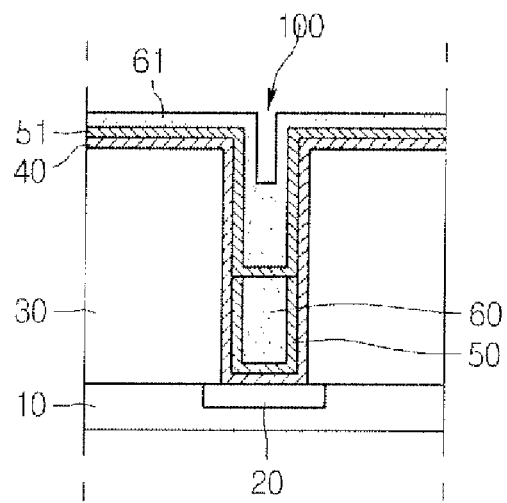

Referring to FIG. 5, a second copper plating layer 61 can be formed oil the second copper seed layer 51 by an ECP process. A bottom-up gapfill process can be performed so that copper is deposited on the first copper plating structure formed in the via hole 1100. As a result, a middle portion of the via hole 100 can be completely filled with copper, while an upper portion of the via hole 100 is not completely filled with copper.

Figure 6:
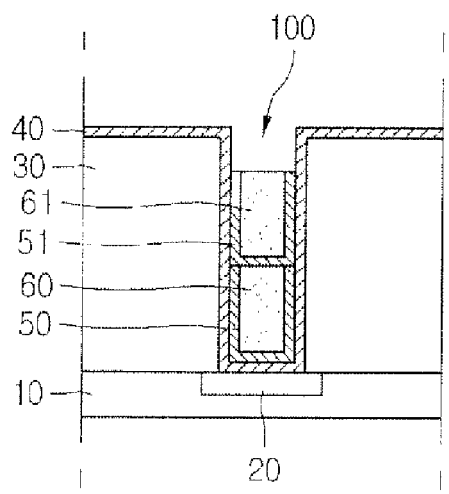

Referring to FIG. 6, the second copper seed layer 51 and the second copper plating layer 61 can be etched to a level that completely fills a middle portion of the via hole 100 horizontally, thereby forming a copper plating structure including the second copper seed layer 51 and the second copper plating layer 61 in the via hole 100. In an embodiment. the height of the second copper seed layer 51 is approximately the same as that of the second copper plating layer 61 after the wet-etching process.

Figure 7:
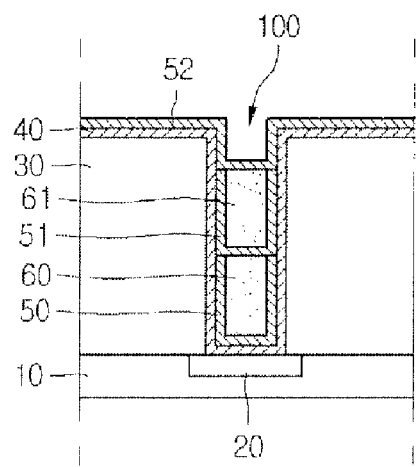

Referring to FIG. 7, a third copper seed layer 52 can be formed on the second copper structure.

Figure 8:
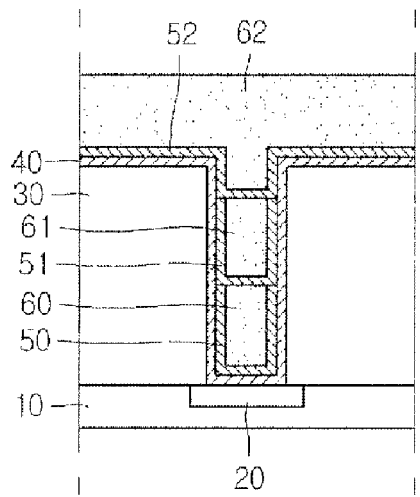

Referring to FIG. 8, a third copper plating layer 62 can be formed on the third copper seed layer 52 by an ECP process. In an embodiment, the third copper plating layer 62 can be deposited on the third copper seed layer 52 through a bottom-up gapfill process in such a way that copper is formed on the third copper seed layer 52 from the top surface of the second copper plating structure to an inlet portion of the via hole 100. As a result, the upper portion of the via hole 100 can be filled with copper so that the via hole 100 is entirely filled with copper.

Referring to FIG. 9, a chemical mechanical polishing (CMP) process can be performed using the ILD layer 30 as an endpoint. Thus, in an embodiment, the third copper plating layer 62 remains only inside the via hole 100, thereby completing a copper metal line.

Accordingly, a void-free copper plating structure can be formed in the lower region of the via hole 100, and a copper seed layer and a copper plating layer can again be formed on the copper plating structure formed in the lower portion of the via hole 100.

Another copper plating structure can be formed on the copper plating structure formed in the lower portion of the via hole 100, which makes it possible to form a copper plating structure that is free of voids and seams in the via hole 100.

Such a process is referred to as a multi copper wet etch (MCWF) process. When a MCWE process is repetitively performed on the via hole 100 having a high aspect ratio, it is possible to prevent or inhibit voids or seams from being created inside the copper plating layer formed in the via hole 100.

The composition of a possible etchant to be used in wet-etching the copper plating layer during a MCWE process is described in Table 1 below.

TABLE 1

| Composition of a possible etchant that may be used in wet-etching of copper plating layer | | | |
|---|---|---|---|
| Option | Units | Possible Value | Possible Range |
| Hydrogen Peroxide | Weight % | 7.0 | 6.5~7.5 |
| Sulfuric Acid | Weight % | 5.5 | 5.0~6.0 |

In many embodiments, after copper is filled in the via hole 100 by an ECP process, the copper in the via hole 100 can be wet-etched to a level of the first copper plating layer 60 that completely fill a lower portion of the via hole 100 horizontally using a predetermined etchant. In an embodiment, the predetermined etchant can be composed of about 6.5% to about 7.5% by weight of hydrogen peroxide and about 5.0% to about 6.0% by weight of sulfuric acid. For example, the etchant of the wet-etching process can be composed of about 7.0% by weight of hydrogen peroxide and about 5.5% by weight of sulfuric acid.

Possible etching time and conditions based on the thickness of a copper plating layer to be etched away during a wet-etching process arc described in Table 2 below.

In certain embodiments, the wet-etching of the copper plating layer can be applied not to a bench type etching apparatus, but to a single wafer-type etching apparatus that processes a single wafer. The etching process can be performed in such a way that a chemical nozzle positioned at a center of a wafer sprays etchant onto the wafer.

TABLE 2

Flow rate of nozzle and etching time according to thickness of etched material during wet-etching of copper plating layer

| | Purpose | Etched material thickness (μm) | Center nozzle flow rate (mL/sec) | Etching time (sec) |
|---|---|---|---|---|
| Primary wet-etching | Remove oxide layer from surface of copper plating layer | Oxide layer <0.05 | 4 | 1 |
| Secondary wet-etching | Etch copper plating layer | 0.10~0.25 | 3 | 1~5 |
| | | 0.25~0.50 | | 1~8 |
| | | 0.50~0.75 | | 1~11 |
| | | 0.75~1.00 | | 1~17 |
| | | 1.00~1.25 | | 1~20 |
| | | 1.25~1.50 | | 1~22 |
| | | 1.50~2.00 | | 1~23 |

Referring to Table 2, the wet-etching process can be performed through two steps. A first step is a primary wet-etching process or removing an oxide layer formed on a surface of a copper plating layer in the via hole 100. In the primary wet-etching process, a thickness of the oxide layer can be less than 0.05 μm, and etchant can be supplied for about one second at a flow rate of 4 mL/sec.

A second step is a secondary wet-etching process of etching the copper plating layer formed in the via hole 100. The copper plating layer can be etched under conditions such that the etchant is constantly supplied at a flow rate of 3 mL/sec, but the etching time can be changed according to the thickness of the copper plating layer.

In the primary and secondary wet-etching processes, etchant and etching time can be changed depending on the thickness of the oxide layer and the copper plating layer.

In addition, in certain embodiments, pre-rinse and post-rinse can be performed using deionized water (DI) solution before and after the secondary wet-etching described in Table 2. Conditions of the pre-rinse and post-rinse are described in Table 3 below.

TABLE 3

Conditions of pre-rinse and post-rinse for wet-etching of copper plating layer

| | DI nozzle flow rate (mL/sec) | Rinse time (sec) |
|---|---|---|
| Pre-rinse | 10 | 1~10 |
| Post-rinse | | 1~15 |

Referring to Table 3, a rinse process can be performed on a water surface before and after the wet-etching process by using DI solution, in order to improve the effectiveness of the wet-etching process.

The pre-rinse is a pre-cleaning during which DI solution can be supplied for 1 to 10 seconds at a (low rate of about 10 mL/sec.

The post-rinse is a pre-wetting during which DI solution can be supplied for 1 to 15 seconds at a flow rate of about 10 mL/sec. In an embodiment, the supply amount or the DI solution can be changed by varying the flow rate from 5 mL/sec to 15 mL/sec.

The present invention makes it possible to improve the gapfill properties of a copper plating layer filled into a via hole by performing an MCWE process. A copper seed layer and a copper plating layer can be deposited and etched repetitively in the via hole which is prepared by damascene process.

In addition, the present invention makes it possible to inhibit the creation of voids and seams when performing a bottom-up gapfill process on a damascene pattern of a semiconductor device. This leads to reduced fabrication costs. Furthermore, the process capability of electrolytically plating copper on small-sized patterns and the fabrication yields of devices can also be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a metal line of a semiconductor device, the method comprising:
    forming an interlayer dielectric layer on a semiconductor substrate including a lower line;
    forming a via hole in the interlayer dielectric layer;
    forming a diffusion barrier layer on the interlayer dielectric layer including in the via hole;
    forming a first copper seed layer and a first copper plating layer on the diffusion barrier layer such that at least part of the first copper seed layer and at least part of the first copper plating layer are in the via hole;
    etching the first copper seed layer and the first copper plating layer to form a first copper plating structure in the via hole;
    forming a second copper seed layer and a second copper plating layer on the first copper plating structure such that at least part of the second copper seed layer and at least part of the second copper plating layer are in the via hole:
    planarizing the semiconductor substrate to expose the interlayer dielectric layer, whereby a copper metal line is provided in the via hole.

2. The method according to claim 1, further comprising:
    etching the second copper seed layer and the second copper plating layer to form a second copper plating structure in the via hole
    forming a third copper seed layer and a third copper plating layer on the second copper plating structure such that at least part of the third copper seed layer and at least part of the third copper plating layer are in the via hole.

3. The method according to claim 1, wherein the first copper seed layer and the first copper plating layer are etched using a wet-etching process.

4. The method according to claim 3, wherein the wet-etching process uses an etchant comprising hydrogen peroxide and sulfuric acid.

5. The method according to claim 4, wherein the etchant comprises from about 6.5% to about 7.5% by weight hydrogen peroxide and from about 5.0% to about 6.0% by weight sulfuric acid.

6. The method according to claim 5, wherein the etchant comprises about 7.0% by weight hydrogen peroxide and about 5.5% by weight sulfuric acid.

7. The method according to claim 3, wherein the wet-etching process comprises:
 removing an oxide layer formed on the first copper seed layer and the first copper plating layer in the via hole; and
 etching the first copper seed layer and the first copper plating layer to a level such that at least a lower portion of the via hole is completely filled.

8. The method according to claim 7, wherein the step of removing an oxide layer comprises supplying an etchant for a period of time of from about 1 second to about 5 seconds at a flow rate of from about 1 mL/sec to about 5 mL/sec.

9. The method according to claim 7, wherein the step of etching the first copper seed layer and the first copper plating layer comprises supplying an etchlant for a period of time of from about 5 seconds to about 23 seconds at a flow rate of from about 1 mL/sec to about 5 mL/sec.

10. The method according to claim 3, further comprising performing a pre-rinse and a post-rinse using deionized water (DI) solution before and after the wet-etching process.

11. The method according to claim 10, wherein the pre-rinse comprises supplying deionized water (DI) solution for a period of time of from about 1 second to about 9 seconds at a low rate of from about 5 mL/sec to about 10 mL/sec.

12. The method according to claim 10, wherein the post-rinse comprises supplying deionized water (DI) solution for a period of time of from about 1 second to about 9 seconds at a flow rate of from about 5 mL/sec to about 15 mL/sec.

13. The method according to claim 1, wherein the via hole is formed over the lower line.

* * * * *